(12) United States Patent
Lindström et al.

(10) Patent No.: US 6,734,111 B2
(45) Date of Patent: May 11, 2004

(54) METHOD TO GAAS BASED LASERS AND A GAAS BASED LASER

(75) Inventors: L. Karsten V. Lindström, Hägersten (SE); N. Peter Blixt, Hägersten (SE); Svante H. Söderholm, Västerås (SE); Laurent Krummenacher, Huddinge (SE); Christofer Silvenius, Stockholm (SE); Anand Srinivasan, Huddinge (SE); Carl-Fredrik Carlström, Farsta (SE)

(73) Assignee: Comlase AB, Hagersten (SE)

( * ) Notice: Subject to any disclaimer, the term of this patent is extended or adjusted under 35 U.S.C. 154(b) by 0 days.

(21) Appl. No.: 09/924,448

(22) Filed: Aug. 9, 2001

(65) Prior Publication Data

US 2003/0032297 A1 Feb. 13, 2003

(51) Int. Cl.$^7$ .............................................. H01L 21/302
(52) U.S. Cl. ......................... 438/718; 438/31; 438/39; 438/714
(58) Field of Search ................... 438/2, 31, 32, 438/37, 39, 40, 46, 47, 34, 35, 38, 42–44, 41, 700–703, 718, 714; 257/80, 81, 82; 372/43, 44–50

(56) References Cited

U.S. PATENT DOCUMENTS

| | | | | |
|---|---|---|---|---|
| 4,706,377 A | * | 11/1987 | Shuskus | 438/285 |
| 5,587,335 A | * | 12/1996 | Mori et al. | 438/29 |
| 5,780,120 A | * | 7/1998 | Belouet et al. | 427/554 |
| 5,942,447 A | * | 8/1999 | Miyakuni | 438/740 |
| 6,303,473 B1 | * | 10/2001 | Heffernan et al. | 438/483 |

* cited by examiner

*Primary Examiner*—Carl Whitehead, Jr.
*Assistant Examiner*—Thanhhas Pham
(74) *Attorney, Agent, or Firm*—Young & Thompson

(57) ABSTRACT

The invention relates to a method using dry etching to obtain contamination free surfaces on of a material chosen from the group comprising GaAs, GaAlAs, InGaAsP, and InGaAs to obtain nitride layers on arbitrary structures on GaAs based lasers, and a GaAs based laser manufactured in accordance with the method. The laser surface is provided with a mask masking away parts of its surface to be prevented from dry etching. The laser is then placed in vacuum. Dry etching is then performed using a substance chosen from the group containing: chemically reactive gases, inert gases, a mixture between chemically reactive gases and inert gases. A native nitride layer is created using plasma containing nitrogen. A protective layer and/or a mirror coating is added.

30 Claims, 3 Drawing Sheets

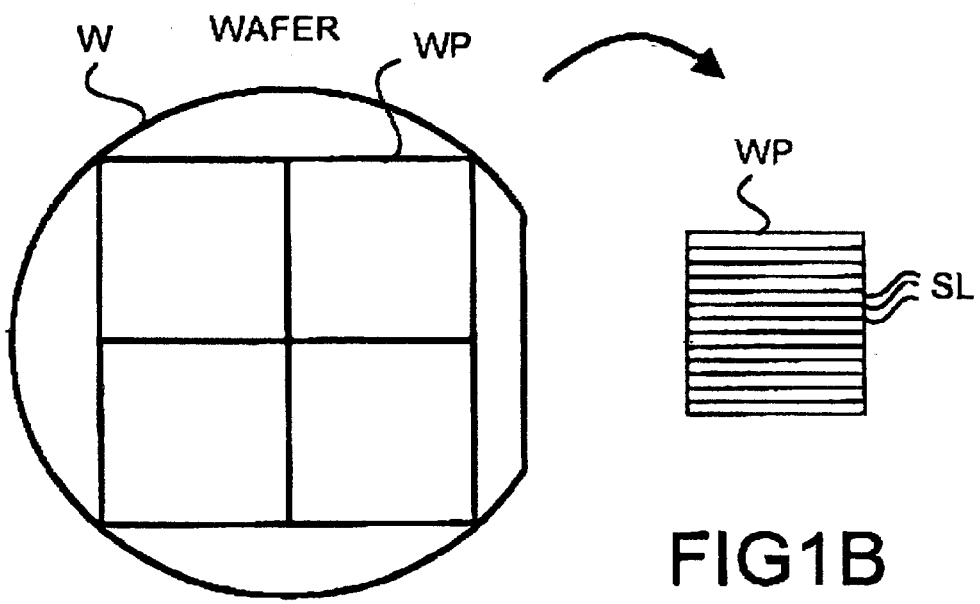
FIG 1A
FIG1B
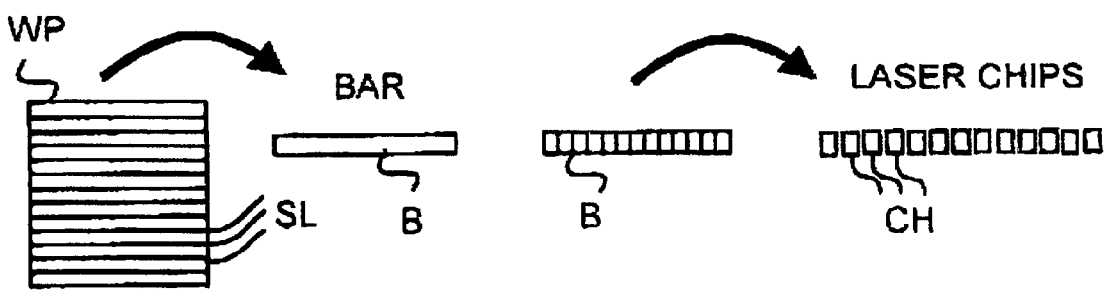
FIG1C
FIG1D

# METHOD TO GAAS BASED LASERS AND A GAAS BASED LASER The present invention relates to a method to obtain nitride layers on arbitrary structures on GaAs based lasers, and a GaAs based laser provided by the method.

The present invention is mainly directed to a method to take care of losses in the wave-guide of GaAs based lasers.

A method directed to solve the problem with degradation of laser facets is disclosed in our co-pending U.S. application Ser. No. 09/924,605.

BACKGROUND

High power 980 nm laser diodes are predominantly used to pump erbium-doped fiber amplifiers (EDFAs). Other applications can be thulium doped fiber amplifiers and Er/Yb doped fibers and wave-guides that use rare earth metal transitions in the 900 . . . 1100 nm band. There are two dominating failure mechanisms of GaAs based pump lasers, namely degradation of laser facets and defects in the wave-guide. The degradation of laser facets by light absorption is known to lead to sudden failures by catastrophic optical damage (COD) and has been one of the major causes for device failure. If COD is taken care of by appropriate laser facet passivation techniques, the wave-guide defects will be dominating.

The losses in the wave-guide originates from:

Light scattering due to roughness in the wave-guide;

Non-radiative recombination via impurities at the surface or recombination via surface states.

A wet chemical etching procedure usually provides excellent smoothness of the wave-guide. Prior dry etching methods, like Reactive Ion Etching (RIE) or Chemically Assisted Ion Beam Etching (CAIBE), yield very high process control, both regarding etching depth and the wall topology. However, these dry etching methods give rougher surfaces than the wet etching methods. The rougher surfaces increase the light scattering as well as surface recombination rate. Both effects are detrimental for modern pump lasers. The scattering will reduce the efficiency. The impurities entering though rough and non-blocking surfaces are even more detrimental to the pump laser. The impurities and the surface states will promote non-radiative recombination, which generates heat. The heat can degrade the material and the surfaces further and more heat will be generated. This process will accelerate and finally the device will fail.

RELATED ART

U.S. Pat. No. 4,448,633 discloses a method to passivate type III–V compound semiconductor surfaces by exposure to a low-pressure nitrogen plasma. The III element forms III element-nitride. This process is referred to as nitridation. The resultant articles have an III element-nitride surface layer, which protects the articles from environmental degradation while reducing the surface state density and permitting inversion of the surface layer. The nitridation is performed in two steps. The first occurs at low temperatures (400–500° C.) to prevent decomposition of the surface by loss of V element. Exposure to nitrogen plasma with a pressure of 0.01–10 Torr results in an initial III-nitride layer having a thickness of about 20–100 Å. The second step is performed at an elevated temperature (500–700° C.) under the same plasma conditions. Here, the nitridation proceeds at a faster rate resulting in a thicker nitrided layer (200–1000 Å). Under the present conditions, if the plasma pressure is in the range 0.01 to about 0.5 Torr the resulting III-coating is polycrystalline, and is single-crystalline when the pressure is in the range 1 to 10 Torr.

U.S. Pat. No. 5,780,120 describes a method of preparing facets of lasers based on III–V compounds. The method comprises of the following operations:

1) The facets of the laser are cut.
2) The facets of the laser are placed in an enclosure in which there obtains a pressure of about 10–7 mbar to about 10–8 mbar, and they are subjected to a step of cleaning by irradiation with a pulsed laser.
3) The same pulsed laser is used to ablate a target so as to subject the exposed facets to a passivation operation, that is 2–20 Å of Si or GaN is deposited.

The deposition can be performed by pulsed laser ablation of a liquid gallium target in a nitrogen atmosphere with Electron Cyclotron resonance (ECR) plasma. Deposition of an additional film such as Diamond Like Carbon (DLC), silicon carbide SiC, or silicon nitride $Si_3N_4$, may be deposited using the same pulsed laser. These coatings are transparent at the wavelength of the laser and are resistant to oxidation. A cleaning step prior to the passivation stage may be performed in an atmosphere of chlorine or bromine, using a pulsed excimer laser. This document suggests that an additional coating is not necessary if GaN is deposited instead of Si. This also suggests that III–N layers are oxygen-proof.

U.S. Pat. No. 5,834,379 describes a process for synthesizing wide band gap materials, specifically GaN, employs plasma-assisted thermal nitridation with $NH_3$ to convert GaAs to GaN. This method can be employed for forming layers of substantial thickness (on the order of 1 micron) of GaN on a GaAs substrate.

Plasma-assisted nitridation using NH3 results in formation of predominantly cubic GaN. The objective of this document is to make sufficiently thick GaN layers and is not directly concerned with laser facet passivation. However, the basic principle relies on nitridation using a plasma source. Such approaches are being used in growth of GaN films.

The above patents address the concept of nitridation of III–V semiconductors using nitrogen plasma.

U.S. Pat. No. 4,331,737 describes an oxynitride film, which contains Ga and/or Al and has O/N ratio of at least 0.15. This film is obtained by relying on, for example, chemical vapour deposition (CVD) technique. The O/N ratio in the film may be varied by, for example, by varying the distance between the substrate and the substance-supply source, or by varying the proportion of an oxidising gas-contained in a carrier gas. This film is used either as a surface passivation film of III–V compound semiconductors such as GaAs, or as an insulating film for active surface portions of IG-FET, or as an optical anti-reflective film.

EP0684671 describes a method, which comprises oxide reduction, hydrogen passivation and deposition of a protective coating layer. The method involves the same PECVD reactor for all steps to avoid oxygen exposure. The cleaved facets (being exposed to air and thus oxidised) are loaded into the reactor. The first step uses hydrogen plasma, which both reduces the group V oxide content and passivates non-radiative recombination centres. The group III oxides are removed by ammonia plasma and the laser facets have their compositional stoichiometry condition restored and are free from contaminants. Coating is then done either by depositing SiN(x) or AlN(x). Minimum stress can also be obtained through creation of a compositional nitrogen gradient.

U.S. Pat. No. 5,668,049 discloses a method of making a GaAs-based semiconductor laser. A fully processed wafer is cleaved, typically in ambient atmosphere into laser bars. The laser bars are loaded into an evacuable deposition chamber (preferably an ECR CVD chamber) and exposed to H2S plasma. The hydrogen is believed to remove native oxides, while the sulfur bonds with Ga and As, thereby lowering the surface state density. Following the exposure, the cleavage facets are coated in the chamber with a protective dielectric (for example, silicon nitride) layer. The patent claims that this method can be practiced with high through-put, and can yield lasers capable of operation at high power.

U.S. Pat. No. 5,144,634 discloses a method for passivating mirrors in the process of fabricating semiconductor laser diodes. Key steps of the method are:

(1) providing a contamination-free mirror facet, followed by (2) an in-situ application of a continuous, insulating (or low conductive) passivation layer.

This layer is formed with a material that acts as a diffusion barrier for impurities capable of reacting with the semiconductor but which does not itself react with the mirror surface. The contamination-free mirror surface is obtained by cleaving in a contamination-free environment, or by cleaving in air, followed by mirror etching, and subsequent mirror surface cleaning. The passivation layer consists of Si, Ge or Sb. A Si layer with a second layer containing $Si_3N_4$ is also claimed.

EP0474952 proposes another method of passivating etched mirror facets of semiconductor laser diodes for enhancing device reliability. The etched mirror facet is first subjected to a wet-etch process to substantially remove any native oxide as well as any surface layer which may have been mechanically damaged during the preceding mirror etch process. Then, a passivation pre-treatment is applied whereby any residual oxygen is removed and a sub-monolayer is formed which permanently reduces the non-radiative recombination of minority carriers at the mirror facet. As pre-treatment $Na_2S$ or $(NH_4)_2S$ solutions can be used. The sulfur passivates the surface electronic states that otherwise are efficient non-recombination centers. Finally, the pre-treated mirror surface is coated with either $Al_2O_3$ or $Si_3N_4$ to avoid any environmental effect.

EP0774809 describes a method to offer a novel passivation layer that can result in improved reliability of semiconductor lasers having a laser cavity defined by laser facets. In a preferred embodiment, the passivation layer is a zinc selenide layer (e.g., 5 nm), formed on an essentially contamination-free laser facet. More generally, the passivation layer comprises at least one of Mg, Zn, Cd and Hg, and at least one of S, Se and Te. Typically, the facets are formed by cleaving in vacuum and followed by in-situ deposition of the novel passivation layer material on the facets.

U.S. Pat. No. 5,851,849 describes a process for passivating semiconductor laser structures with severe steps in the surface topography. The technique involves atomic layer deposition to produce the passivating layer which has exceptional coverage and uniformity, even in the case of trench features with trench aspect ratios as large as 5. In addition, the passivation produced by this process has excellent environmental stability, and affords protection against air born contaminant induced degradation. The coating process is carried out in a vacuum chamber. The primary feature of the process is the formation of the coating by a multiplicity of process cycles in which each cycle produces essentially an equivalent mono-layer of the passivating film. In the specific example described here the passivating film was $Al_2O_3$ and the reactant gases were trimethylaluminum $[(CH_3)_3Al]$.

The above patents mainly address different passivation methods. Typically, the processes are complicated and involve at least two steps. In some cases, special techniques and/or materials (gases, precursors etc) are used. Nevertheless, most of these deal with means to reduce surface state density, which is one of the important factors to suppress COD.

The article "Cleaning of GaAs Surfaces with Low-Damage Effects Using Ion-Beam Milling" by C. Lindström and P. Tihanyi, the Journal IEEE Trans. on electron Devices, Vol.ED-30, NO.6, June 1983. With ion-beam milling of the laser diode mirror surface an etch depth of 50–100 Ångström reduces the oxygen atomic percentage by 97–99% as determined by Auger depth profiling. From the same report the difference between milling with heavy Ar ions and lighter N ions were demonstrated. The important result was that N ions had no measurable detrimental influence on the laser diode performance while milling with Ar ions affected the performance negatively in the milling process. After 140 Ångström milling depth with Ar ions the power output and power conversion efficiency started to decline. However, with the introduction of N ions in the milling process no parameter changes were observed for the milling depth studied i.e. 200 Ångström.

The effect of Ar ion milling followed by N ion milling on the laser performance is also described in this article. Here, the lighter N ions remove the damage caused by the heavier Ar ions and restore the deteriorated power output performance. The conclusion from these observations is that N ion milling smoothens the mirror facet to a uniform surface similar to what is observed for surfaces mechanically cleaved in the crystal plane with a correspondingly reduced number of surface states.

The Article "Low resistance ohmic contacts on nitrogen ion bombarded InP", Ren et al, Appl. Phys. Lett. 65, 2165 (1994) reports on electrical and chemical properties of InP surfaces milled by low energy (100–300 eV) nitrogen-ions. Incorporation of nitrogen is evidenced by Secondary Ion Mass Spectroscopy (SIMS) analysis and formed polycrystalline InN was identified by transmission electron microscopy (TEM). In the process, the native oxide on the sample surface is also removed by the milling.

The article "Nitridation of an InP (100) surface by nitrogen ion beams", Suzuki et al, Appl. Surf. Sci. 162–163, 172 (2000) describes a study of nitridation of InP (100) by low energy nitrogen ion milling. The investigators used X-ray photoelectron spectroscopy (XPS) for chemical analysis and to identify the bonding states. The ion energy ranged from 100 eV to 1 KeV. The milled surfaces show In—N, In—N—P and P—N bonding states. Disappearance of In—N—P upon annealing (400° C.), suggests lower binding energies for these bonds compared to In—N. However, nitridation efficiency decreases with increasing ion energy due to sputter erosion.

The article "Characterization of damage in InP dry etched using nitrogen containing chemistries", C. F. Carlström and S. Anand, by J. Vac. Sci. Technol. B (to appear September/October 2001) addresses etching of InP using different of processes containing nitrogen in the etch-chemistry, including nitrogen ion milling. The surfaces are extremely smooth with rms. roughness<1 nm with milling at 75 eV. A thin near surface nitrogen containing layer is present. A high temperature treatment (650° C.) under phosphine, removes most of the incorporated nitrogen.

The article "Synthesis of InNxP1-x thin films by N ion implantation", Yu et al, Appl. Phys. Lett. 78, 1077 (2001) describes implantation of nitrogen, which is carried out to form dilute InNxP1-x layers. Nitrogen ions were sequentially implanted with selected energies to form 350 nm thick layers and upon rapid thermal annealing (RTA) in flowing nitrogen (with proximity cap) the InNP alloy layers were formed.

Although, the articles above focus on different issues, the message is incorporation of nitrogen into InP during nitrogen ion milling. In addition, the results suggest that N binds to both In and P, the latter being less stable. The nitridation procedure needs to be optimized so as to have predominantly In—N in the layer. At the same time the surface must be smooth. The last work listed (Yu et al.) above offers another means to form a nitrided layer, but it is restricted in that an all-InN layer is not obtained. But, it suggests that after nitridation by ion-milling, RTA may be an additional step that may be necessary.

Nitridation of GaAs has received a great deal of attention. One of the primary concerns has been to reduce surface state density and the focus is often on Metal Insulator Semiconductor (MIS) structures. (However, the methodology and/or results could also be valid for laser-facet preparation.) Below, a few selected references are summarized, with more attention to plasma assisted nitridation schemes.

The article "Nitridation of GaAs using helicon-wave excited and inductively coupled nitrogen plasma", Hara et al, J. Vac. Sci. Technol. B 16, 183 (1998) demonstrate nitridation of GaAs by special plasma treatment containing mixtures of nitrogen and argon, and/or, nitrogen and oxygen. However, pure nitrogen plasma is not commented upon. The authors show by X-ray photoelectron Spectroscopy (XPS) analysis that Ga—N bonds are formed and under certain conditions only small amounts of Ga and As sub-oxides were found. They show that nitridation suppresses oxide formation. The authors have investigated C-V characteristics of MIS devices using this procedure and found improvements. Further, photoluminescence yield is high for treated samples indicating lower surface/interface state densities. This work explicitly focuses on MIS aspects and there is no mention of the same procedure being applicable for pump lasers.

The article "Surface cleaning and nitridation of compound semiconductors using gas-decomposition reaction in Cat-CVD method", Izumi et al, Proc. Int. Vac. Congress, August 31–September 4, Burmingham, UK, 1998 describes the use of a gas-decomposition reaction involving Ammonia in a catalytic CVD (cat-CVD) system to for cleaning and nitriding GaAs surfaces. The authors use XPS to investigate the chemical bonding states near the surface. They claim disappearance of oxygen related peaks after their process. The proposal is that dissociation of ammonia results in hydrogen, which cleans the surface by removing the oxides, and in nitrogen, which forms Ga—N by a exchange reaction. That is, nitrogen efficiently replaces As. This work mentions only MIS applications.

The articles "Nitridation of GaAs (110) using energetic N+ and $N_2$+ ion beams", L. A. DeLouise, J. Vac. Sci. Technol. A11, 609 (1993) and "Reactive $N_2$+ ion bombardment of GaAs (110): A method for GaN thin film growth", J. Vac. Sci. Technol. A10, 1637 (1992) use XPS to analyse nitridation of GaAs (110) upon bombardment using nitrogen ion beams (500 eV to 3 KeV). It is demonstrated that lower surface densities are obtained with nitrogen compared to Ar and is attributed to the formation of stable predominantly Ga—N bonds. Again both these articles refer to MIS-like applications and the ion energies are relatively high.

The article "$NH_3$ plasma nitridation process of 100-GaAs surface observed by XPS", Masuda et al, J. J. Appl. Phys. Part 1, 34 1075 (1995) describes XPS studies of nitridation of GaAs using ammonia plasma show formation of Ga—As—N layer. However, under certain conditions, the authors claim formation of only Ga—N layer due to desorption of As. They also report that the layer is oxidation resistant.

The article "XPS investigation of GaAs nitridation mechanism with an ECR plasma source", Sauvage-Simkin et al, Phys. Stat. Solidi A176, 671 (1999) describes formation of beta-GaN in GaAs samples exposed to nitrogen ECR plasma from XPS studies. An amorphous layer formation is evidenced, which could favour nitrogen incorporation but should be controlled to stabilize Ga—N bonds.

The article "III–V surface plasma nitridation: A challenge for III–V nitride epigrowth", Losurdo et al, J. Vac. Sci. Technol. A17, 2194 (1999) describes the increased efficiency of nitridation in the presence of hydrogen. It is proposed that hydrogen enhances desorption of group V elements.

The article "Nanometer scale studies of nitride/arsenide heterostructures produced by nitrogen plasma exposure of GaAs", Goldman et al, J. Electronic Mat. 26, 1342 (1997) describes the use of a sophisticated tool, scanning tunnelling microscope (STM), to investigate plasma nitridation of GaAs. The authors find that the nitrided layer is not a continuous film, as also found in some other works reported above. Instead it is composed of defects (As—N) and clusters (GaN with dilute As). These results show that defects that could be detrimental to device performance can also be formed. However, if appropriate nitridation conditions and possible annealing steps are used, the defects can be minimized.

The article "Surface passivation of GaAs by ultra-thin cubic GaN layer", Anantathasaran et al, Appl. Surf. Sci. 159–160, 456 (2000) describes the use of a nitrogen plasma to form a thin cubic GaN layer and use XPS and RHEED to analyze the samples. All these processing were performed under Ultra High Vacuum (UHV) conditions. The PL measurements show an order of magnitude increase in intensity compared to as-grown samples indicating good passivation properties of the nitrided layer.

The main import from the literature is that nitridation of GaAs is possible using nitrogen plasma. Some articles above have also addressed nitridation by nitrogen-ion bombardment. Most reported works refer to MIS structures for motivation and no explicit reference to pump-laser facet passivation by nitridation is mentioned. Some reports also show that the formed nitrided layer is non-uniform and could require some additional processing steps such as annealing.

Two articles describe passivation of laser facets.

The article "Reliability improvement of 980 nm laser diodes with a new facet passivation process", Horie et al, IEEE Jour. of selected topics in quantum electronics 5, 832 (1999) demonstrates improved laser performance with a three step facet preparation. The laser bars are cleaved in air, thus increasing the yield. However, the facet preparation procedure involves three steps accomplished under vacuum conditions, making it somewhat complex. The procedure itself involves low-energy Ar-ion milling, followed by a-Si layer deposition and then finally an $AlO_x$ coating layer deposition. The problem here is that after Ar-milling, the surface cannot be exposed to ambient air. Nothing is mentioned about nitrogen milling.

The article "A highly reliable GaInAs—GaInP 0.98 $\mu$m window laser", Hashimoto et al, IEEE J of quantum electronics 36, 971 (2000) describes the use of implantation of nitrogen and subsequently RTA to cause atomic inter-diffusion near the active region at the facet. The basic mechanism is creation of defects by selective nitrogen implantation. Upon RTA, the defects assist in increased atomic inter-diffusion and cause the band-gap near the facet to increase (window laser). However, in this work the authors do not give details of implantation etc. The nitridation effect or rather the formation of dilute nitrogen containing alloy is not commented upon. Nevertheless, their procedure of nitrogen implantation and RTA, does show a band-gap increase of about 100 meV as seen from Photo-Luminescence (PL) measurements.

The article "Simulation of mesa structures for III–V semiconductors under ion beam etching", by L. Houlet et al, Eur. Phys. J. AP Vol 6, p. 273–278 (1999) discusses using several graphic examples the different shapes obtained in ion-milling of mesas. Angle dependence of milling, mask-erosion, mask-edge faceting and their implications on etch profile developments are discussed.

PROBLEM DESCRIPTION

There are basically two methods used for forming the laser wave-guide of GaAs based pump lasers, GaAs substrate with either ternary systems, such as with GaAlAs active layer, or quartenary systems, such as with InGaAsP active layer, or GaInP active layer, namely dry and wet etching.

The dry etching method is usually plagued by:

Rough surfaces, which give scattering losses of the laser-beam, which reduces the output power.

No passivation layer blocking impurities from reacting with the semiconductor material.

Rough surface that will yield high number of surface states and thereby high non-radiative recombination.

The wet chemical etching is plagued by the following problems:

Poor process control.

Topologies are very limited due to the isotropic etch rate.

Wet chemicals contain large amount of impurities. No true cleaning of surface.

No native passivation layer to block impurities.

THE INVENTION

An object of the invention is to provide a method to obtain nitride layers on arbitrary structures on GaAs based lasers through dry etching where scattering losses are minimized.

Another object of the invention is to provide a method to obtain nitride layers on arbitrary structures on GaAs based lasers through dry etching blocking any impurity to react with the active material.

Still another object of the invention is to provide a method to obtain nitride layers on arbitrary structures on GaAs based lasers through dry etching having a low surface state density.

Yet another object of the invention is to provide a method to obtain nitride layers on arbitrary structures on GaAs based lasers through dry etching giving smooth surfaces and low surface recombination rate.

Still another object of the invention is to provide a method to obtain nitride layers on arbitrary structures on GaAs based lasers through dry etching giving a laser structure in which generation of heat is brought to a minimum, The method in this application is directed to dry etch structures on the epitaxial layer side of a wafer and subsequently form a native nitride layer on the same structure.

There are several structures that can be formed by the dry etching method according to the invention, namely:

Ridge or Mesa-structures to define a wave-guide.

Trenches, for example, to define a wave-guide, to provide current blocking, or for improved thermal conductivity.

Corrugated periodic structures with sub-micron resolution, e.g. DFB and DBR structures.

Etched facets

Additional nitride layers can be applied to:

(i) Fill pinholes;

(ii) Planarize; and (iii) Remove heat by having higher thermal conductivity than GaAs and air.

The method according to the invention is to nitridise the surface of a laser chip, preferably while several laser-chips are still on the wafer, where they are first manufactured, after an etching process, such as milling with a gas comprising atomic nitrogen or nitrogen ions, in a vacuum chamber. The etching process starts in order to make the mesas, ridges, trenches, corrugations, facets etc. of the laser surface to define the laser channel(s). Introduction of a reactive gas like nitrogen in the etching process will certainly affect the crystal surface properties since it reacts with the crystal elements and creates a nitrided surface layer.

Thus, the etching process is performed using chemically reactive gases and inert gases and a mixture between these and in particular argon, nitrogen, hydrogen and chlorine. The following nitridisation is performed with a plasma containing nitrogen either in ionic form or in atomic form.

The essential concept behind this nitridisation is the formation of a nitride layer at the laser surface/facets that (a) prevents chemical contamination (for example oxidation), (b) provides a higher band-gap surface layer, and (c) possibly also reduces the surface/interface carrier recombination velocity.

By laser surface is meant the surface comprising ridge, mesa, corrugation, trenches etc.

By laser facets is meant the front and back laser facets, which most often are perpendicular to the laser surface.

Hydrogen gas during ion milling of the laser surface/facets (a) helps to clean the laser surface more effectively, especially the oxidized areas, since hydrogen is known to be effective in removing surface oxides, and (b) aids in the removal of group V elements in a III–V crystal making formation of group III-nitrides more favourable.

The nitrided surface layer so formed so the laser surface during nitrogen ion milling could be reinforced, particularly to even out surface interruptions and pin holes, if any, by subsequent deposition of an additional nitride film which may contain a metal from the groups 3a, 4a, such as any of the following elements: Si, Ga.

A contamination free surface is created either (a) with a surface nitrided layer so formed by nitrogen ion milling (with or without hydrogen), (b) with a surface nitrided layer so formed by nitrogen ion milling (with or without hydrogen) and an additional over-layer of deposited nitride film, or (c) with a mild nitrogen ion milling followed by nitridisation by neutral atomic nitrogen.

Prior to coating, the so-created contamination-free surface could be sealed by a passivation layer of such properties that non-radiative carrier recombination at the nitride-passivation layer coating interfaces is reduced to a minimum. Contrarily, direct deposition of coating on the so-created contamination free surface may result in appreciable non-radiative carrier recombination via interface states at the nitride-mirror coating interface.

Thus, the invention relates to a method using dry etching to obtain contamination free (GaAlAs—InGaAs) surfaces on of a material chosen from the group comprising GaAs, GaAlAs, InGaAs, InGaAsP and InGaAs to obtain nitride layers on arbitrary structures on GaAs based lasers, comprising:

provide the laser surface with a mask masking away parts of its surface to be prevented from dry etching;

place the laser in vacuum;

perform dry etching using following material: chemically reactive gases, inert gases, a mixture between chemically reactive gases and inert gases;

creation of a native nitride layer using plasma containing nitrogen using an extracted beam;

Addition of a protective layer and/or a mirror coating.

The method could further comprise starting the dry etching using a substance assisted plasma comprising at least one substance from the group comprising chemically inert and reactive gases, such as nitrogen, hydrogen, argon and halogen compounds (e.g. Cl, Br, or I based compounds) and hydrocarbon gases (e.g. $CH_4$ and $C_2H_6$), and mixtures of them. The facets could be passivated after obtaining a contamination free surface by using a nitrogen assisted plasma. The dry etching could be performed with a nitrogen assisted plasma or with a plasma where the substance is a mixture of nitrogen and another gas, the other gas being gradually replaced by nitrogen until only nitrogen plasma is provided. The dry etching could also be performed with a gas free of nitrogen, the gas being gradually replaced by nitrogen until only nitrogen plasma is provided. The nitrogen plasma could contain nitrogen ions, atomic nitrogen, or molecular nitrogen.

Hydrogen could be added to the substance assisted plasma for enhancing removal of oxides.

The milling substance could be argon. Then a nitride layer is started to be grown onto the contamination free surface during introduction an element from the group comprising ionized nitrogen, atomic nitrogen, and molecular nitrogen to the substance assisted plasma and in reaction with the contamination free surfaces. An interface between the contamination free surfaces and the grown nitride layer is made gradual making use of a native nitridisation in order to minimize interface recombination between different layers.

The nitride layer preferably uses plasma comprising nitrogen with an extracted beam, the nitride layer consisting of at least one material chosen from the group comprising: AlN, GaN, InN, InAsN. Addition in-situ or ex-situ deposition of thin nitride film is preferably provided on the native nitride layer using reactive plasma in combination with at least one element from the groups 2b, 3a, 4a, and 5a, such as Si, Ga, Zn, Al. At least one further film could be added to further reduce interface surface recombination prior to adding the protective layer and/or mirror coating. A further thin film or thin films could be added after the in-situ or ex-situ deposition of the thin film to further reduce interface surface recombination prior to providing the protective layer and/or mirror coating.

The vacuum could be a vacuum between 10 Torr to $10^{-11}$ Torr, preferably less than $10^{-7}$ Torr. The gases could be chosen from at least one element from the group containing: argon, nitrogen, hydrogen and chlorine. Smooth surface morphology at the dry etching could be enhanced with specific energy range 0 to 2000 eV in combination with alternate incident beam angles from 0° to 90° from a normal incident angle. Smooth surface morphology at the dry etching could also be enhanced with specific energy range 50 to 500 eV in combination with alternate incident beam angles from 0° to 85° from a normal incident angle. The nitrogen impinging on the laser surface is nitrogen ions accelerated by an electric field, e.g. a Radio Frequency field or a microwave field. The nitrogen ions could be composed of nitrogen ions either in atomic or in molecular form, of a mixture of these. The nitrogen impinging on the laser surface could be neutral nitrogen atoms, which are impinging on the surface with thermal energies.

The nitride layer could comprise at least one element chosen from the group comprising; AlN, GaN, InN, InAsN. The deposited and nitridised layers could be obtained in combination followed by an annealing procedure. The procedure could be performed to a number of GaAs based lasers simultaneously before they are divided from a wafer comprising the GaAs based lasers held together. A pattern defined by standard lithography process could be provided onto the wafer. The pattern comprises preferably photo-resist material to prevent dry-etching within certain areas, such as ridge or mesa tops. The dry etching and nitridising could form at least one of the following structures: mesa, ridge, trenches, corrugated periodic structures, with sub-micron resolution to define a waveguide facet. The periodic structures could have sub-micron resolution, such as DFB and DBR structures.

An additional nitride layer could be provided to fill pinholes, to planarize the surface and/or to remove heat by having higher thermal conductivity than GaAs and air. By the dry etching and nitridising each whole laser chip could be formed etched at the front side of a wafer comprising:

first kind of grove/trench in the wafer surface down through an active region, each of the cuts having a triangular form having one side normal to the wafer surface though the active region and provided with a front facet layer of a laser chip and a second smoothed side inclined to the normal cut provided with a highly reflected layer to bend a laser beam emitted from the front facet layer;

second kind of grove/trench down through the active region having at least one side turned towards the active region and normal to the surface of the wafer, which side is provided with a highly reflective layer, about 95% reflectivity.

The invention also relates to a GaAs based laser comprising:

a first n-doped layer, a second p-doped layer and an active region with quantum wells in-between the first and second layers, each layer comprising a material chosen from the group comprising GaAs, GaAlAs, InGaAsP and InGaAs;

a laser channel in the active region;

a surface structure on an outer surface of the first layer defining the channel;

a native nitride layer next to the outer surface of the first layer except on predetermined positions on the structure;

protection layer and/or mirror coating on the outside of the native layer.

Additional in-situ or ex-situ deposition of thin nitride film could be provided on the native nitride layer, the nitride film comprising at least one element from the groups 2*b*, 3*a*, 4*a*, and 5*a*, such as Si, Ga, Zn, Al. A further thin film or thin films could be provided above the in-situ or ex-situ deposition of the thin nitride film. At least one further film to further reduce interface surface recombination provided under the protective layer and/or mirror coating.

ADVANTAGES

The new method according to the invention is based on ion-milling using nitrogen as one vital constituent. The benefits of using this method to form for example laser wave-guide structure are five-fold.

The surface will be much smoother than conventional wet and dry etching methods, thereby minimizing the scattering losses.

The nitrogen ion-beam milling process can form a native nitride layer, which blocks any impurity to react with the active material.

The native nitride layer will have lower surface state density than an ex-situ deposited nitride layer and thereby minimize the associated recombination rate.

Advanced topologies can be etched like ridges, trenches, Distributed Feedback (DFB) and Distributed Bragg reflectors (DBR) and facets.

Optional nitride layer (e.g. AlN, SiN, GaN, InN, InAsN) or any other layer without changing or damaging the semiconductor surface can be deposited on the native nitride layer for planarization and thermal dissipation.

BRIEF DESCRIPTION OF THE DRAWINGS

For a more complete understanding of the present invention and for further objects and advantages thereof, reference is now made to the following description of examples of embodiments thereof—as shown in the accompanying drawings, in which:

FIGS. 1A to 1D illustrate a process for manufacturing semiconductor lasers;

DETAILED DESCRIPTION OF EMBODIMENTS

Referring to FIG. 1A, when manufacturing semiconductor lasers a wafer W of semiconductor diodes is produced, each diode having an n doped layer, a p doped layer and an active region in-between. For example the n-doped layer could comprise n-doped GaAs and the p-doped layer p-doped GaAs. The active region should preferably be un-doped, however, it might contain some doping species from the surrounding layers. Hence it is low-doped and could comprise a number of thin layers.

The active region could contain layers of AlGaAs and/or InGaAs. As illustrated in FIGS. 1A and 1B, this wafer could be divided into some smaller wafer parts WP. Each wafer part is scribed with scribe lines SL where cleaving should be made. As illustrated in FIG. 1C, the wafer part WP should then be cleaved into bars B along the scribe lines SL. The other side of the wafer is placed over an edge and is broken at each scribed line. In order to make laser chips of a bar, a mirror facet is provided at each end of the cleaved section of the bar. As illustrated in FIG. 1D, each bar is subsequently cleaved into chips CH. In the case of pump lasers one of the mirror facets is high reflectivity (HR) coated and the other is anti reflective (AR) coated. The laser beam is emitted in the active region sideways in the active region of each semiconductor diode chip out through the anti reflective coated laser mirror. The manufacturing process briefly described above is usual.

This invention relates to obtain nitride layers on-arbitrary structures on GaAs based lasers through dry etching preferably made on the wafer or wafer part before it is cut into bars.

Figure 2:
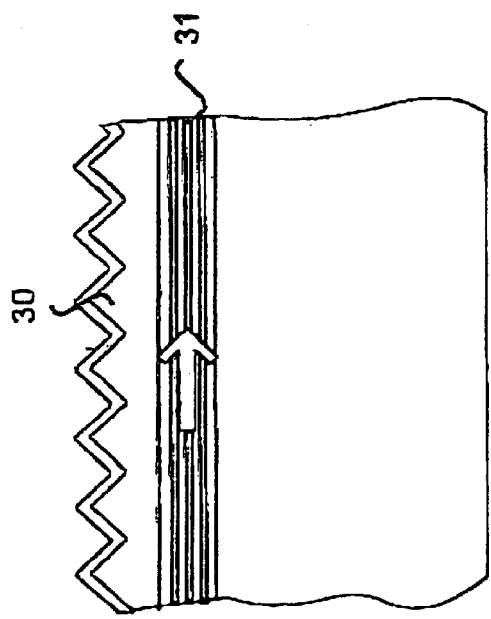
FIG. 2 illustrates a section perpendicular to the laser beam direction for a first embodiment of the laser according to the invention and shows a ridge above the active laser layer.

A laser wafer, shown in the embodiment in FIG. 2, comprises a p-doped layer 2, an n-doped layer 3, and an active layer 4 with quantum wells.

The contamination free (GaAlAs—InGaAs) surfaces on the layer 3 comprises a material chosen from the group comprising GaAs, GaAlAs, InGaAs, InGaAsP and InGaAs. Nitride layers should be obtained on arbitrary structures on GaAs based lasers.

In front of and parallel with a channel 5 for the laser beam in the active layer 4 there is a ridge or mesa 6, by which the channel is defined. A mesa is shown in FIG. 2. The ridge or mesa is provided by dry etching with inclined side surfaces 7 and 8 having angles to the horizontal plane, which could be arbitrary. The ridge or mesa has also a top surface 9, which is essentially parallel to the wafer surface.

Firstly the surface to be treated is to be cleaned. Therefore, a dry etching of the wafer surface is started in the vacuum chamber, for instance as ion beam etching, using a plasma of inert and/or reactive gases, such as nitrogen, hydrogen, argon, and chlorine gases and mixtures of them. The addition of reactive gases such as halogen gases (e.g Cl, Br, or I based compounds) or hydrocarbon gases (e.g $CH_4$ and $C_2H_6$) to the dry etching step may help to assure that the surface is well defined, smooth and stoichiometric once the following nitridation process step starts. This is so since the reactive gases promote removal of Ga to counter the preferential etching of As that occurs under physical etching i.e. ion milling.

The dry etching could thus comprise ion milling using argon plasma at the beginning. This is the preferred embodiment, since the argon plasma makes an effective milling procedure and is followed by a nitrogen milling. Further, the crystal structure, which is to have the contamination free surfaces at crystal mirror facets, may also consist of the following elements: Se and Sb.

Examples of other dry etching techniques which could be used for both the dry etching and nitridation steps are parallel plate reactive ion etching (RIE), inductively coupled plasma reactive ion etching (ICP), electron cyclotron resonance plasma reactive ion etching (ECR), barrel reactor and downstream reactor. Other dry etching techniques well known to those skilled in the art (including those mentioned above) can also be used. The plasma excitation can for example be performed by supplying microwave electric power, radio frequency electric power or DC electric power.

Hydrogen gas during ion milling of the laser facets helps in some way to reduce the surface contamination and specially oxidized areas since hydrogen is known to react with oxides and remove the oxygen in the form of water. This procedure continues until a contamination free surface has been obtained. If an argon plasma has been used at the ion milling the laser surface is passivated by adding nitrogen gas to the argon plasma and gradually remove argon until only nitrogen plasma is provided in a step like manner. Thus, the ion milling is completed with a nitrogen milling in order to obtain extremely smooth surface morphology as a final plasma in the ion beam milling process.

After the application of a deposition layer 10 of the wafer surface comprising a native nitride layer nearest to the layer 3, and described below, a layer 11 of electrically conducting material is intended to be provided at the top surface 9 of the ridge 6 having a bond wire (not shown) electrically connected to a controllable current supply. The laser is pumped at the control of the current supply. Therefore, the top surface 9 is not provided with the nitride layer 10.

The invention is not limited to a gradual interface, even if that is preferred. It could as well be abrupt. The milling could then be provided by only using nitrogen (either ionic or atomic) and probably with an addition of hydrogen. The important feature, however, is that a native nitride layer is provided after the dry etching, and hence not a nitride layer comprising other components than what is provided at the surface. Preferably, there is no interface between the different layers. The first native nitridised layer could comprise GaN/InN/AlN/AlGaN. Since the concentration of incorporated nitrogen varies continuously into the crystal also for direct nitrogen ion milling, nitridation without any real abrupt interface layer may also be obtained by directly performing nitrogen ion milling, without any other dry etching prior to it or any other gases added to the nitrogen ion milling process.

The native nitride layer so formed on the surface during nitrogen assisted ion milling could be strengthened with at least one extra layer of deposited nitride particularly in order to even out surface interruptions and possible pin holes in the first nitride film. This extra film or these extra films could comprise the same nitride but also nitrides other than the native one, for example SiN, GaN, etc.

A way to obtain extremely smooth surface morphology could be provided by using nitrogen as a final plasma in an ion beam milling process. Very smooth surfaces have been obtained on different semiconductor materials like GaAs, InP when using nitrogen in comparison to argon in the plasma.

A protection layer 12 is provided above the deposition layer 10.

A mask is provided at the ridge top surfaces 9 before the nitride layer is performed.

Thus, to sum up, the wafer is run through the following process steps:

1. Place wafer in vacuum between 10 Torr to $10^{-11}$ Torr, preferably less than $10^{-7}$ Torr.
2. The wafer should have a pattern defined by a standard lithography process. The pattern could comprise photo-resist material to prevent dry-etching within certain areas, such as the ridge tops.
3. Dry etching will be performed using chemically reactive gases and inert gases and a mixture containing these, and in particular argon, nitrogen, hydrogen and chlorine.
4. Smooth surface morphology is enhanced with specific energy range 50 to 500 eV in combination with alternate incident beam angles from 0° to 85° from the normal incident angle.
5. Creation of a passivating nitride layer using plasma containing nitrogen using an extracted beam. The nitrogen impinging on the laser surface can either be nitrogen ions accelerated by an electric field (plus optional Radio Frequency (RF) and microwave fields) or an nitrogen ion beam that is neutralized and the nitrogen atoms are impinging on the surface with thermal energies.
6. Nitride layer consisting of AlN, GaN, InN, InAsN and combination of these.
7. Additional in-situ or ex-situ deposition of thin nitride film using reactive plasma in combination with material like Si, Ga, Zn and Al.
8. Addition of a thin film or thin films to further reduce interface surface recombination prior to providing a protective layer and/or mirror coating.
9. All these depositions and nitridization steps could be performed in combination with or followed by an annealing procedure
10. Addition of a protective layer and/or a mirror coating.

Thus, in order to etch the mesa or ridge before coating with the deposition layers and at the coating, the beams are preferably moved with alternate incident beam angles. In this way a more even result will be provided than if the incident beam angle is normal. The passivating nitride layer nearest to the layer 3 will be native. The essential concept behind this is that the formation of a nitride layer at the facet prevents chemical contamination (for example oxidation) and also provides a higher band-gap surface layer and/or a layer that reduces the interface carrier recombination velocity.

The etching could be proceeded with any well known dry etching process, for instance $Ar/Cl_2$ based Chemical Assisted Ion Bean Etching (CAIBE), Reactive Ion Bean Etching (RIBE), or other kinds of etching including Ar-ion milling to first define the ridge or mesa profiles in the prescribed way. After that the step with nitrogen-ion milling and with possibility of varying the incidence angle and energy. Alternatively, it is possible to mill directly with nitrogen ions and, depending on the obtained profiles, complete the last etching step, again with milling but with a different angle and rotation of the wafer.

The additional nitride layers can be applied to:
(iv) Fill pinholes;
(v) Planarize; and
(vi) Remove heat by having higher thermal conductivity than GaAs and air.

Side-wall damage could happen with dry etching. This could be minimized by using low energy process. It is also possible to remove created damage by a last low energy ion milling, incorporating nitrogen, and at the same time remove the damaged layer from the previous ridge or mesa defining process.

Figure 3:
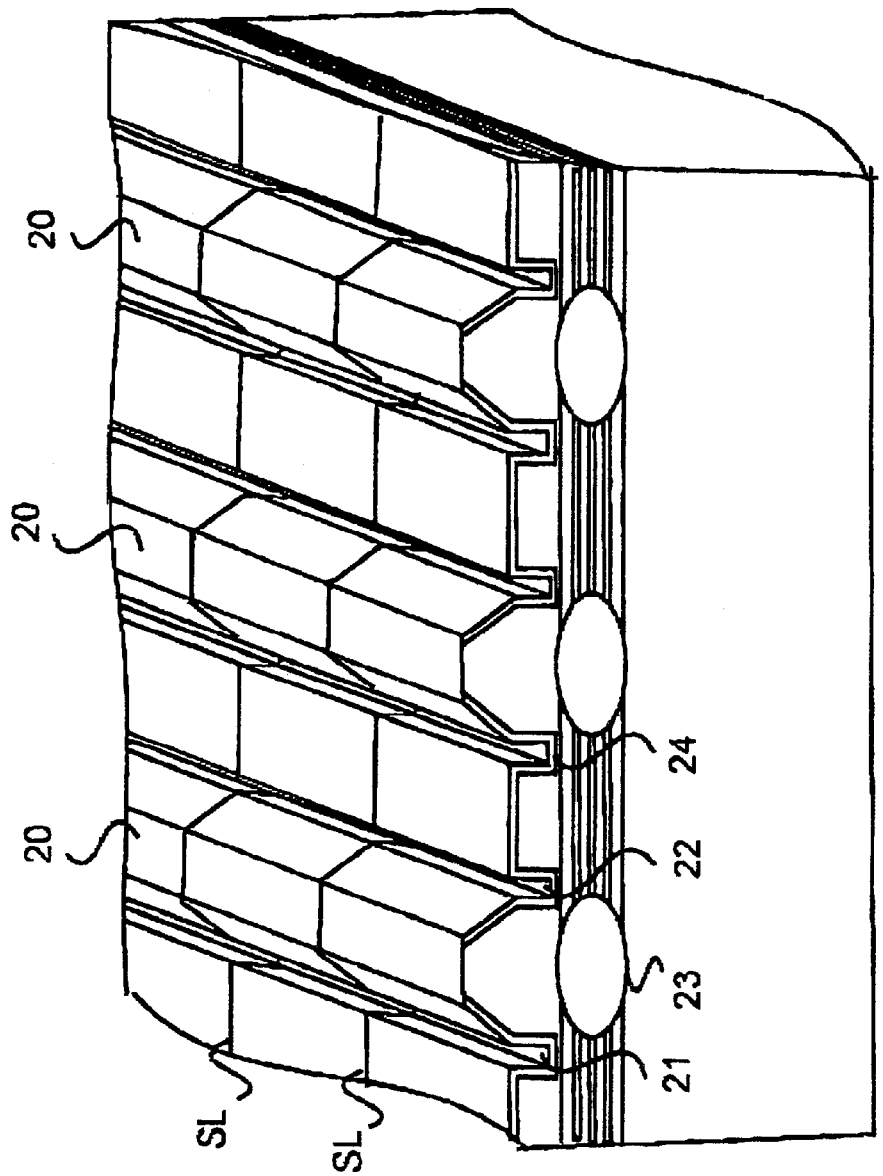
FIG. 3 is a perspective view, partly in section, of a wafer in accordance with a second embodiment of the laser structure according to the invention.

According to a second embodiment of the invention FIG. 3 shows a wafer part with a ridge-structure 20 for each laser unit. The ridge-structure has a trench 21, 22 on each side for example to define a wave-guide 23 for the laser beam, cause current blocking, or for improved thermal conductivity. Deposition layer 24 is provided on the ridge-structure 20 and in the trenches 21, 22. In order to have the vertical sides of the trenches dry-etched and coated with the deposition layer the incident and extracted, respectively, beams are moved with alternate beam angles.

The wafer part is provided with scribe lines SL where cleaving into bars should be made. The wafer is shown without the protecting layer, which is provided onto the deposition layer in the same way as in the embodiment shown in FIG. 2.

Figure 4:
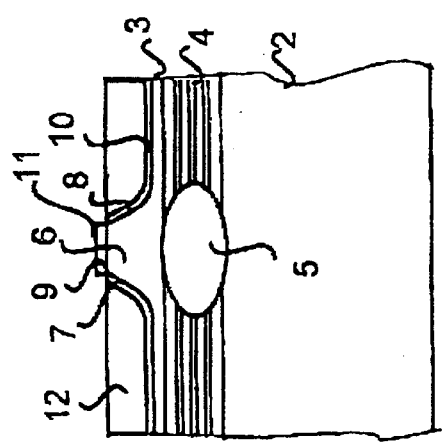
FIG. 4 illustrates a section parallel to the laser beam direction of a third and fourth embodiment of the laser according to the invention and shows a corrugated surface above the active laser layer.

It is the ridge, which defines the wave-guide. Current limit could be used in order to provide a single transverse mode below the ridge or mesa. Also trenches affect the mode and could give a more stable single-mode Referring to FIG. 4, in which the third embodiment is shown. FIG. 4 shows a section perpendicular to those shown in FIG. 2 and in the front section of FIG. 3. A mesa or ridge profile 30 parallel to the laser channel in the active layer 31 is provided with corrugated periodic structures with sub-micron resolution, e.g. Distributed Feedback (DFB) and Distributed Bragg reflectors (DBR) structures. The side surfaces are preferably inclined even in this embodiment.

However, this need not necessarily be a ridge, the corrugation could also be provided for planar structures. In planar structures the active region 31 is enclosed in a material having a lower refractive index and this demands re-growing. The quarternary material InGaAsP is a material, which is suited for re-growing. This fourth embodiment is not shown in a separate Figure, since such a Figure will not be different from FIG. 4.

The corrugated structure will preferably be positioned above the active layer both in the third and fourth embodiments. The corrugated structure is intended to provide a periodic refractive index variation, which then determines the wave-length through resonant coupling. Thus, periodic corrugated structures are manufactured by dry etching and in-situ, native nitridation by using nitrogen in an ion beam.

It is also possible to have a corrugated structure for a part of the laser, which is passive, i.e. no stimulated emission. The structure is called Distributed Bragg Reflector (DBR). It does not matter if the corrugated structure is provided only in a part of the laser, above or below (not shown) the active layer, or even if the corrugated is etched down into the active layer. The dry etch method according to the invention could be used to provide any of the corrugated structure mentioned above.

Figure 5:
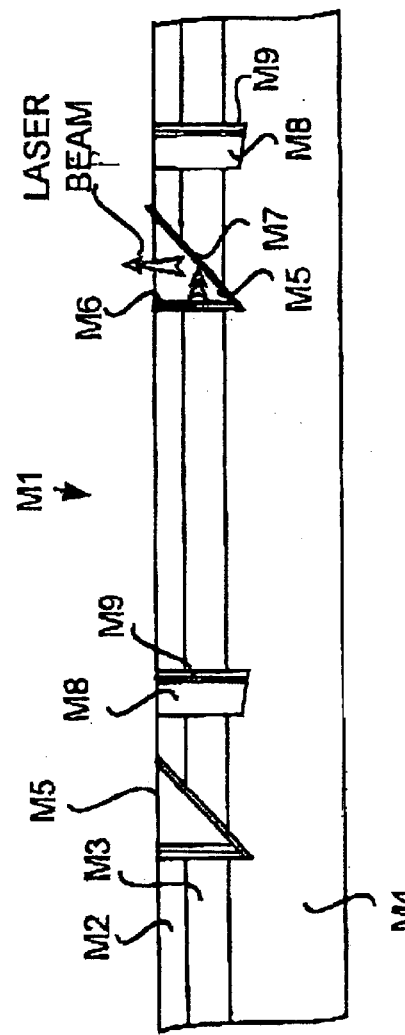
FIG. 5 illustrates a section parallel to the laser beam direction of a fifth embodiment of a wafer comprising laser chips performed directly in the wafer.

Referring to FIG. 5, a fifth embodiment is described, in which each whole laser chip is etched at the front side of a wafer. A whole laser is shown in the middle. A part of a laser is shown on each side of it in order to illustrate that the lasers are provided one after the other in a string on the wafer. It is also to be noted that the wafer contains a number of such parallel laser stings in the direction perpendicular to the plane of the paper.

The laser wafer M1 having a p-doped layer M2, an active region M3, and an n-doped layer M4 has some groves M5. Each of them have a triangular form having one side M6 normal to the wafer turned to the active region M3 in order to function as the front facet of a laser chip and a side M7 preferably 45° to the normal side M6.

The side M6 is a laser front facet for the laser beam in the active region M3 and has been dry etched and treated in the same way as described above. It is then provided with an anti-reflection layer (AR-layer) by ZnSe or GaN or a transparent dielectric in order to make it act as the front mirror of the laser, from which the laser beam is emitted. The side M7 represents a tilted mirror turning the laser beam LB perpendicular to the surface of the wafer. This side M7 is thus smoothed in particular and provided with a high reflective surface overlayer.

A number of vertical groves M8 is provided, each grove having at least one side M9 turned towards the active region M3 normal to the surface of the wafer. This side is intended to function as the back mirror facet of a laser chip. It is thus dry etched treated in the same way as described above. It is then provided with a highly reflective layer, about 95% reflectivity.

It is to be noted that the passivation layer treatment for both the back and front facet mirrors can be provided simultaneously in this embodiment. The whole surface turned upwards in FIG. 5 could thus be treated in the same way as the mirrors, such that the whole surface is dry etched and provided with a native nitride layer. However, the antireflective layer of the facet M6 and the high reflective layer of the facet M9 in each laser bar are provided while shielding the other parts of the wafer surface. Also the highly reflective mirror M7 is provided with its reflective layer while the rest of the surface is shielded.

Although the invention is described with respect to exemplary embodiments it should be understood that modifications can be made without departing from the scope thereof. Accordingly, the invention should not be considered to be limited to the described embodiments, but defined only by the following claims, which are intended to embrace all equivalents thereof.

We claim:

1. A method of obtaining nitride layers on arbitrary structures located on GaAs-based lasers by using dry etching to obtain contamination free surfaces on a material chosen from the group consisting of GaAs, GaAlAs, InGaAsP, and InGaAs, comprising:

providing a prospective laser surface with a mask masking away parts of the laser surface to be prevented from dry etching, the laser surface being of a material of the group consisting of GaAs, GaAlAs, InGaAsP, and InGaAs;

placing the laser surface in a vacuum;

performing dry etching of the laser surface to obtain an etched surface with a surface structure using a substance assisted plasma comprising nitrogen and another gas, said dry etching being performed while said another gas being gradually replaced by nitrogen until only nitrogen plasma is provided;

creating a native nitride layer on the etched surface using plasma containing nitrogen, to nitridize the etched surface of the laser surface;

adding a further layer of one of a protective layer and a mirror coating over said native nitride layer.

2. The method according to claim 1, wherein said dry etching is performed with a nitrogen assisted plasma.

3. The method according to claim 1, further comprising:
adding hydrogen to said substance assisted plasma for enhancing removal of oxides located on the laser surface.

4. The method according to claim 1 wherein said another gas being Ar.

5. The method according to claim 1, further comprising:
starting to grow the native nitride layer onto said contamination free surface during introduction of an element from the group consisting of ionized nitrogen, atomic nitrogen, and molecular nitrogen to said substance assisted plasma and in reaction with said contamination free surface; and making an interface between said contamination free surface and said grown nitride layer, by gradual use of a native nitridisation.

6. A method according to claim 1, further comprising:
creating said native nitride layer using plasma comprising nitrogen with an extracted beam, said native nitride layer consisting of at least one material chosen from the group comprising: AlN, GaN, InN, InAsN.

7. The method according to claim 1, further comprising:
providing additional in-situ or ex-situ deposition of thin nitride film on said native nitride layer using reactive plasma in combination with at least one element from element groups IIb, IIIa, IVa, and Va.

8. A method according to claim 7, further comprising:

adding at least one further film to reduce interface surface recombination prior to adding said further layer.

9. The method according to claim 7, further comprising:

adding a further thin film or thin films after said in-situ or ex-situ deposition of said thin film to further reduce interface surface recombination prior to providing said further layer.

10. The method according to claim 1, wherein said vacuum is vacuum between 10 Torr to $10^{-11}$ Torr.

11. The method according to claim 1 wherein said dry etching using the substance assisted plasma comprising nitrogen and at least one element from the group consisting of argon, hydrogen and chlorine.

12. A method according to claim 1, further comprising:

enhancing smooth surface morphology at said dry etching with specific energy range 0 to 2000 eV in combination with alternate incident beam angles from 0° to 90° from a normal incident angle.

13. The method according to claim 1, comprising:

enhancing smooth surface morphology at said dry etching with specific energy range 50 to 500 eV in combination with alternate incident beam angles from 0° to 85° from a normal incident angle.

14. The method according to claim 6, wherein said plasma comprising nitrogen impinging on the laser surface is nitrogen ions accelerated by an electric field.

15. The method according to claim 14, wherein said nitrogen ions are composed of nitrogen ions either in atomic or in molecular form, of a mixture of these.

16. The method according to claim 14, wherein said electric field is a Radio Frequency field.

17. The method according to claim 14, wherein said electric field is a microwave field.

18. The method according to claim 6, wherein said plasma comprising nitrogen impinging on the laser surface are neutral nitrogen atoms, which are impinging on the surface with thermal energies.

19. The method according to claim 1, wherein said native nitride layer comprises at least one element chosen from the group comprising: AlN, GaN, InN, InAsN.

20. The method according to claim 1, comprising:

obtaining said native nitride layer followed by an annealing procedure.

21. The method according to claim 1, wherein the laser surface is a laser wafer for yielding a number of GaAs based lasers simultaneously, and to providing the further layer, the wafer is divided into plural GaAs based lasers.

22. The method according to claim 21, comprising:

providing a pattern defined by standard lithography process onto said wafer.

23. The method according to claim 22, wherein said pattern comprises photo-resist material to prevent dry-etching within ridge and mesa top areas.

24. The method according to claim 1, wherein the surface structure is at least one of a mesa, a ridge, trenches, corrugated periodic structures, with sub-micron resolution to define a waveguide facet.

25. The method according to claim 24, wherein said periodic structures are one of DFB and DBR structures.

26. The method according to claim 1, comprising:

a step of providing an additional nitride layer filling pinholes on the laser surface.

27. The method according to claim 1, comprising:

a step of providing an additional nitride layer to planarize said laser surface.

28. The method according to claim 1, comprising:

a step of providing an additional nitride layer with a higher thermal conductivity than GaAs and air.

29. The method according to claim 24, wherein, said steps of dry etching and providing a native nitride layer are performed on a whole laser chip etched at the front side of a wafer comprising:

first kind of grove/trench in the wafer surface down through an active region, with cuts having a triangular form having one side normal to the wafer surface through said active region and provided with a front facet layer of the laser chip and a second smoothed side inclined to the normal cut provided with a highly reflected layer to bend a laser beam emitted from said front facet layer; and second kind of grove/trench down through said active region having at least one side turned towards said active region and normal to the surface of the wafer, which side is provided with a highly reflective layer of about 95% reflectivity.

30. The method of claim 1, wherein the native nitride layer is a gallium nitride layer.

* * * * *